US009728176B2

(12) United States Patent
Keck et al.

(10) Patent No.: US 9,728,176 B2
(45) Date of Patent: Aug. 8, 2017

(54) ACTIVE DESIGN OF EXHAUST SOUNDS

(71) Applicant: Eberspächer Exhaust Technology GmbH & Co. KG, Neunkirchen (DE)

(72) Inventors: Mathias Keck, Esslingen (DE); Martin Romzek, Fenton, MI (US)

(73) Assignee: Eberspächer Exhaust Technology GmbH & Co. KG, Neunkirchen (DE)

( * ) Notice: Subject to any disclaimer, the term of this patent is extended or adjusted under 35 U.S.C. 154(b) by 29 days.

(21) Appl. No.: 14/636,667

(22) Filed: Mar. 3, 2015

(65) Prior Publication Data

US 2015/0255054 A1 Sep. 10, 2015

(30) Foreign Application Priority Data

Mar. 4, 2014 (EP) .................................... 14157687

(51) Int. Cl.

| | |
|---|---|
| ***H03G 3/00*** | (2006.01) |
| ***G10H 5/10*** | (2006.01) |
| ***F01N 1/02*** | (2006.01) |
| ***F01N 1/04*** | (2006.01) |
| ***F01N 1/06*** | (2006.01) |

(Continued)

(52) U.S. Cl.
CPC ............... *G10H 5/10* (2013.01); *F01N 1/023* (2013.01); *F01N 1/04* (2013.01); *F01N 1/065* (2013.01); *G10K 11/175* (2013.01); *H04R 1/00* (2013.01); *F01N 2310/02* (2013.01); *F01N 2470/02* (2013.01); *F01N 2470/14* (2013.01); *F01N 2470/16* (2013.01); *F01N 2470/18* (2013.01); *F01N 2470/22* (2013.01);
(Continued)

(58) Field of Classification Search
None
See application file for complete search history.

(56) References Cited

U.S. PATENT DOCUMENTS 4,177,874 A 12/1979 Angelini et al.
4,665,549 A * 5/1987 Eriksson ............ G10K 11/1788 181/222

(Continued)

FOREIGN PATENT DOCUMENTS

DE 197 51 596 A1 6/1999
DE 10 2006 042 224 B3 1/2008

(Continued)

OTHER PUBLICATIONS

English translation of EP0481450.*
Japanese Office Action of Jan. 28, 2016.
European Office Action of Feb. 29, 2016.

*Primary Examiner* — Joseph Saunders, Jr.
*Assistant Examiner* — James Mooney
(74) *Attorney, Agent, or Firm* — McGlew and Tuttle, P.C.

(57) ABSTRACT

A sound generator (1) includes a casing (10) with at least one exhaust gas inlet (11) and at least one exhaust gas outlet (12) that is different from the at least one exhaust gas inlet (11) and at least one electro-acoustical transducer (20). The electro-acoustical transducer (20) is configured to produce sound in dependence on an electrical control signal. The electro-acoustical transducer (20) is located within the casing or directly attached to the casing. An active noise control system (9) includes the sound generator (1). A vehicle (8) with an internal combustion engine (6) includes the active noise control system (9).

20 Claims, 3 Drawing Sheets

(51) Int. Cl.
*G10K 11/175* (2006.01)
*H04R 1/00* (2006.01)

(52) U.S. Cl.
CPC .................... *F01N 2490/08* (2013.01); *G10K 2210/12822* (2013.01); *G10K 2210/32272* (2013.01); *H04R 2499/13* (2013.01)

(56) References Cited

U.S. PATENT DOCUMENTS

| | | | | |
|---|---|---|---|---|
| 5,097,923 | A * | 3/1992 | Ziegler | F01N 1/065 181/206 |
| 5,229,556 | A | 7/1993 | Geddes | |
| 5,233,137 | A | 8/1993 | Geddes | |
| 5,336,856 | A | 8/1994 | Krider et al. | |
| 5,343,533 | A | 8/1994 | Geddes | |
| 5,432,857 | A | 7/1995 | Geddes | |
| 5,600,106 | A | 2/1997 | Langley | |
| 5,619,020 | A | 4/1997 | Jones et al. | |
| 5,693,918 | A | 12/1997 | Bremigan et al. | |
| 8,434,590 | B2 * | 5/2013 | Keck | F01N 1/026 181/228 |
| 2007/0205043 | A1 | 9/2007 | Krueger et al. | |
| 2008/0302598 | A1 | 12/2008 | Nicolai et al. | |
| 2011/0127105 | A1 | 6/2011 | Lim et al. | |
| 2012/0097478 | A1 | 4/2012 | Keck | |

FOREIGN PATENT DOCUMENTS

| | | | |
|---|---|---|---|
| DE | 10 2008 018 085 | A1 | 10/2009 |
| DE | 10 2009 031 848 | A1 | 1/2011 |
| EP | 0 373 188 | A1 | 6/1990 |
| EP | 0 481 450 | A1 | 4/1992 |
| EP | 0 674 097 | A1 | 9/1995 |
| EP | 0 755 045 | A2 | 1/1997 |
| EP | 0 916 817 | A2 | 5/1999 |
| EP | 1 055 804 | A1 | 11/2000 |
| EP | 1 627 996 | A1 | 2/2006 |
| EP | 1 832 725 | A2 | 9/2007 |
| EP | 2 000 637 | A1 | 12/2008 |
| EP | 2 444 605 | A1 | 4/2012 |
| JP | S58214614 | A | 12/1983 |
| JP | H2112913 | U | 9/1990 |
| JP | H05 98927 | A | 4/1993 |
| JP | H09105321 | A | 4/1997 |
| JP | H10232683 | A | 9/1998 |
| JP | 2000-110542 | A | 4/2000 |
| JP | 2000-145428 | A | 5/2000 |
| WO | 89/07701 | A1 | 8/1989 |

* cited by examiner

ACTIVE DESIGN OF EXHAUST SOUNDS

CROSS REFERENCE TO RELATED APPLICATIONS

This application claims the benefit of priority under 35 U.S.C. §119 of European Patent Application EP 14 157 687.6 filed Mar. 4, 2014, the entire contents of which are incorporated herein by reference.

FIELD OF THE INVENTION

The invention concerns the active design of exhaust sounds for vehicles that are operated with internal combustion engines. The internal combustion engine may be part of a hybrid drive unit. The invention relates in particular to the influencing of the overall acoustic pattern of exhaust sounds.

BACKGROUND OF THE INVENTION

The operation of internal combustion engines, regardless of the particular internal combustion engine design, such as reciprocating engines, piston-less rotary engines or free-piston engines, occurs in repeated strokes in each of which certain processes are carried out, such as intake and compression of a fuel and air mixture, combustion, and discharging of the combusted fuel air mixture, or the like. The sounds generated hereby partially propagate through the engine directly as solid-borne sound. Another portion of the sound generated exits along with combustion gases through an exhaust system of the engine as air-borne sound. In an exhaust line of the exhaust system, this air-born sound is superimposed by flow noise of the combustion gases. The sound resulting from this superimposition is called exhaust sound. Finally, a remaining part of the sound generated exits through an intake system of the engine.

The sounds propagated through the internal combustion engine as solid-borne sound can generally be well insulated by suitable insulating materials in the engine compartment of a vehicle.

To reduce the acoustic emissions escaping with the exhaust gases, sound-absorbing devices are usually arranged in the exhaust duct. Such sound-absorbing devices are called mufflers. Mufflers can operate, for example, according to the absorption and/or reflection principle. Furthermore, it is known to provide mufflers with resonating chambers harmonically tuned to cause destructive interference wherein opposite sound waves cancel each other out.

It is a disadvantage with such systems that they increase the back pressure of the exhaust gas flowing in the exhaust gas system, thus decreasing efficiency of the combustion engine. It is a further disadvantage with such systems that, especially in the case of modern diesel vehicles, and vehicles with hybrid drive systems, the sound actually leaving the exhaust gas system is not appealing to a user.

Therefore, active sound systems have been developed for use in exhaust systems of vehicles with which it is possible to generate an exhaust sound synthetically. Corresponding systems have an electro-acoustical transducer that is connected to the exhaust line of an internal combustion engine by a connector piece in order to superimpose electro-acoustically generated sound waves on the sound waves stemming from the combustion process in the engine or generated by the flow of exhaust gas in the exhaust gas system. In this way, the exhaust sounds of a vehicle can be deliberately modified. The electrical input signal of the transducer is generated by a control as a so-called control signal, taking into account current values of engine parameters, such as engine speed or firing order. The electro-acoustical transducer is housed by a housing separate from the exhaust line and thus requires additional space in the undercarriage of a vehicle.

Active sound systems may be used as anti-noise systems as well as an alternative or supplement to mufflers, for example. Anti-noise systems superimpose electro-acoustically generated anti-noise on airborne noise generated by the internal combustion engine and propagated through the exhaust system. Respective anti-noise systems may use a so-called Filtered-X, Least Mean Squares (FxLMS) algorithm trying to bring the airborne noise propagating through the exhaust system down to zero (in the case of noise-cancellation) or to a preset threshold (in the case of influencing noise) by outputting sound using at least one loudspeaker. The loudspeaker of anti-noise systems is usually in fluid communication with the exhaust system. For achieving a completely destructive interference between the sound waves of the airborne sound propagating through the exhaust system and the anti-noise generated by the loudspeaker, the sound waves originating from the loudspeaker have to match the sound waves propagating through the exhaust system in amplitude and frequency with a relative phase shift of 180 degrees. If the sound waves of the airborne noise propagating through the exhaust system match the anti-noise sound waves generated at the loudspeaker in frequency and have a phase shift of 180 degrees relative thereto, but do not match in amplitude, only an attenuation of the sound waves of the airborne sound propagating through the exhaust system results. The anti-noise may be calculated separately for each frequency band of the airborne noise propagating through the exhaust pipe using the FxLMS-algorithm by determining a proper frequency and phasing of two sine oscillations being shifted with respect to each other by 90 degrees, and by calculating the required amplitudes for these sine oscillations. Respective systems are for instance known from the following documents: U.S. Pat. Nos. 4,177,874, 5,229,556, 5,233,137, 5,343,533, 5,336,856, 5,432,857, 5,600,106, 5,619,020, EP 0 373 188, EP 0 674 097, EP 0 755 045, EP 0 916 817, EP 1 055 804, EP 1 627 996, DE 197 51 596, DE 10 2006 042 224, DE 10 2008 018 085 and DE 10 2009 031 848.

The objective of active sound systems may be that the cancellation or influencing of sound is audible and measurable at least outside of the exhaust system. As the case may be, the cancellation or influencing of sound is audible and measurable also inside the exhaust system.

It is a disadvantage with such active sound systems that they need to be fail-safe to meet legal provisions of noise protection. Therefore, they are often used as a supplement to existing mufflers. However, the space in the undercarriage of a vehicle is very limited.

SUMMARY OF THE INVENTION

Embodiments are directed to the provision of an active noise control system that is particularly compact and thus requires only a small space of the undercarriage of the vehicle with an internal combustion engine.

Embodiments of a sound generator for an active noise control system for a vehicle with internal combustion engine, comprise a first casing and at least one electro-acoustical transducer. The first casing has at least one exhaust gas inlet and at least one exhaust gas outlet different from the at least one exhaust gas inlet. The at least one electro-acoustical transducer is configured to produce sound in dependence of an electrical control signal and is located within the first casing or directly attached to the first casing. In this respect, the term “directly” means that there is not provided a separate tube to connect the at least one electro-acoustical transducer to the casing. This does not exclude the provision of gaskets or distance pieces having a longitudinal extension of less than 40 mm and especially less than 20 mm and further especially less than 5 mm.

Consequently, the at least one electro-acoustical transducer of the sound generator is directly integrated into an exhaust gas system and uses components of the exhaust gas system. Thus, the first casing is used both to guide exhaust gas and to support and/or house the at least one electro-acoustical transducer.

According to an embodiment, the at least one electro-acoustical transducer may be completely surrounded by the first casing. Thus, the first casing prevents the at least one electro-acoustical transducer against external influences such as moisture or mechanical impact.

According to an alternative embodiment, the at least one electro-acoustical transducer may be attached to side wall of the first casing in a way that the at least one electro-acoustical transducer covers a hole or several holes in the sidewall. The at least one hole is provided in front of the at least one electro-acoustical transducer to allow sound generated by the at least one electro-acoustical transducer to enter the first casing. In case one single hole is provided in the side wall of the first casing, the diameter of the hole may be slightly smaller than the diameter of the electro-acoustical transducer. In this respect, “slightly smaller” means that the diameter of the hole is less than 10% smaller or less than 5% smaller than the diameter of the electro-acoustical transducer covering the hole.

According to an embodiment, the first casing is air-tight insofar as exhaust gas can only enter and exit the casing through the at least one exhaust gas inlet and the at least one exhaust gas outlet.

According to an embodiment, the first casing contains a chamber, wherein the chamber is in fluid communication with both the exhaust gas inlet and the exhaust gas outlet and wherein the chamber is lined with sound absorbing material, especially roving fiberglass. Thus, the first casing can be the casing of a muffler functioning according to the absorbing principle that is commonly used by the muffler and the at least one electro-acoustical transducer of the sound generator.

According to an embodiment, the first casing contains a resonating chamber harmonically tuned to cause destructive interference. Thus, the first casing can be the casing of a muffler functioning according to the reflection or destructive interference principle that is commonly used by the muffler and the at least one electro-acoustical transducer of the sound generator. According to an embodiment, the chamber is a cavity resonator using Helmholtz resonance Thus, the first casing can be the casing of a muffler functioning according to the destructive interference principle that is commonly used by the muffler and the at least one electro-acoustical transducer of the sound generator.

According to an embodiment, the sound generator further comprises at least one flexible membrane coupled to the first casing in an air-tight manner so as to separate the at least one electro-acoustical transducer from the exhaust gas inlet and the exhaust gas outlet. By the provision of a flexible membrane corrosive exhaust gas can be prevented from reaching the at least one electro-acoustical transducer while sound waves generated by the at least one electro-acoustical transducer still can enter the first casing via the flexible membrane. The flexible membrane may be made of heat-resisting silicone or a heat-resisting foil made of Polytetrafluoroethylene, an acryloyl group, or polyethylene terephthalate, for example. Furthermore, the thermal load on the at least one electro-acoustical transducer is reduced as the at least one electro-acoustical transducer is not in direct contact with the hot exhaust gas.

According to an embodiment the at least one electro-acoustical transducer comprises an acoustic diaphragm, the acoustic diaphragm forming part of a walling of the first casing. Thus, the at least one electro-acoustical transducer can be a moving coil loudspeaker, for example. The acoustic diaphragm may be made of Poly(p-phenylenterephthalamide) (PPTA) known as Kevlar, titanium, aluminum or other heat-resistant material, for example. The acoustic diaphragm and the first casing may be made of different materials.

According to an embodiment, the first casing contains at least one bridge wall, the bridge walls each being coupled to the first casing so as to define at least two chambers separated from one another by the at least one bridge wall. The first casing further contains at least a supply conduit, each supply conduit being connected to one of the at least one exhaust gas inlets, extending through one of the chambers and communicating with another chamber. The first casing further contains at least one exhaust conduit, each exhaust conduit being connected to one of the at least one exhaust gas outlets, extending through one of the chambers and communicating with another chamber. Thus, the first casing can be a muffler functioning according to the reflection or destructive interference principle. According to an alternative embodiment, the first casing contains at least two bridge walls spaced apart from one another, the bridge walls each being coupled to the first casing so as to define at least three chambers, wherein neighboring chambers are separated from one another by one of the bridge walls. The first casing further contains at least a supply conduit, each supply conduit being connected to one of the at least one exhaust gas inlets, extending through one of the chambers and communicating with another chamber. The first casing further contains at least one exhaust conduit, each exhaust conduit being connected to one of the at least one exhaust gas outlets, extending through one of the chambers and communicating with another chamber. Thus, the first casing can be a muffler functioning according to the reflection or destructive interference principle.

According to an embodiment, the first casing contains one bridge wall coupled to the first casing so as to define first and second chambers separated from one another by the bridge wall. The first casing further contains at least one supply conduit, each supply conduit being connected to one of the at least one exhaust gas inlets, extending through the first chamber and communicating with the second chamber. The first casing further contains at least one exhaust conduit, each exhaust conduit being connected to one of the at least one exhaust gas outlets, extending through the first chamber and communicating with the second chamber. The at least one electro-acoustical transducer is arranged opposing an open end of at least one of the supply and exhaust conduits. Thus, the first casing can be a muffler functioning according to the reflection or destructive interference principle.

In this document the term “arranged opposing an open end” relating to the at least one electro-acoustical transducer arranged opposing an open end of one of the supply and exhaust conduits means that a main direction of sound emission by the at least one electro-acoustical transducer is directed towards the open end of one of the supply and exhaust conduits.

According to an embodiment, the first casing contains two bridge walls coupled to the first casing so as to define first, second and third chambers separated from one another by the bridge walls. The first casing further contains at least one supply conduit, each supply conduit being connected to one of the at least one exhaust gas inlets, extending through the first and second chambers and communicating with the third chamber. The first casing further contains at least one exhaust conduit, each exhaust conduit being connected to one of the at least one exhaust gas outlets, extending through the third and second chamber and communicating with the first chamber. The at least one electro-acoustical transducer is arranged opposing an open end of at least one of the supply and exhaust conduits.

According to an embodiment, the supply and exhaust conduits each contain a section where the supply and exhaust conduits are guided in parallel to each other. In this section, exhaust gas may be guided in the supply and exhaust conduits in the same direction or in opposite directions.

According to an embodiment, the sound generator contains two or more exhaust gas inlets, two or more exhaust gas outlets and two or more electro-acoustical transducers. One of the electro-acoustical transducers is arranged opposing an open end of the supply conduit connected to one of the exhaust gas inlets and the other one of the electro-acoustical transducers is arranged opposing an open end of another supply conduit connected to another one of the exhaust gas inlets.

According to an alternative embodiment, the sound generator contains two or more exhaust gas inlets, two or more exhaust gas outlets and two or more electro-acoustical transducers. One of the electro-acoustical transducers is arranged opposing an open end of the exhaust conduit connected to one of the exhaust gas outlets and the other one of the electro-acoustical transducers is arranged opposing an open end of another exhaust conduit connected to another one of the exhaust gas outlets.

According to an embodiment, at least one of the bridge walls is perforated or all bridge walls are perforated. According to a further embodiment, at least one of the conduits is perforated or all conduits are perforated. According to a further embodiment, at least one of the bridge walls is unperforated or all of the bridge walls are unperforated. According to yet another embodiment, at least one of the conduits is unperforated or all of the conduits are unperforated. Consequently, both some or all of the bridge walls and some or all of the conduits may be perforated or unperforated, or some or all of the bridge walls may be perforated and some or all of the conduits may be unperforated, or some or all of the bridge walls may be unperforated and some or all of the conduits may be perforated. It is emphasized that neither the bridge walls nor the conduits must be perforated over the whole extension thereof. For example, the conduits may only be perforated in a section, or not at all. Perforation of the bridge walls and/or conduits may facilitate the provision of a Helmholz-resonance.

According to an embodiment, sound absorbing material such as e.g. roving fiberglass is disposed in at least one of the chambers.

According to an embodiment, the sound generator further comprises at least one second casing different from the first casing, the second casing being attached to the first casing or being housed in and supported by the first casing, wherein the second casing houses the at least one electro-acoustical transducer. The second casing may protect the at least one electro-acoustical transducer against external influences such as water or mechanical impact. Usage of the second casing may facilitate mounting of the at least one electro-acoustical transducer in the first casing or to the first casing.

According to an embodiment, the sound generator further comprises at least one second casing different from the first casing. The second casing houses the at least one electro-acoustical transducer. The at least one electro-acoustical transducer comprises an acoustic diaphragm. The acoustic diaphragm is sealed against the second casing. Thus, the second casing and the acoustic diaphragm define an internal volume of the electro-acoustical transducer. This internal volume serves as air suspension with respect to the acoustic diaphragm. Thus, the at least one electro-acoustical transducer can be a moving coil loudspeaker having a separate casing, for example. The acoustic diaphragm may be made of Poly(p-phenylenterephthalamide) (PPTA) known as Kevlar, titanium, aluminum or other heat-resistant material, for example. The acoustic diaphragm and the first casing and/or second casing may be made of different materials.

According to an embodiment, the first casing and/or second casing is made of metal and especially stainless steel. According to an embodiment, a gasket is provided between the first casing and the second casing.

According to an embodiment, the electro-acoustical transducer is a moving coil loudspeaker. According to an alternative embodiment, the electro-acoustical transducer is different from a moving coil loudspeaker.

According to an embodiment, the first casing is mounted to the second casing in a removable manner e.g., by using screws. According to an alternative embodiment, the first casing is mounted to the second casing in a non-removable manner e.g., by welding.

Embodiments of an active noise control system comprise the above described sound generator and a control unit. The control unit is configured to create an electrical control signal and to supply the same to the electro-acoustical transducer of the sound generator. The electrical control signal is suitable to drive the electro-acoustical transducer in a manner to partially and especially completely cancel exhaust sound waves guided in an exhaust gas system of the vehicle.

Embodiments of a vehicle comprise a combustion engine and the active noise control system as described above. The exhaust gas inlet of the sound generator of the active noise control system is connected to the combustion engine and the exhaust gas outlet of the sound generator of the active noise control system is connected to a tailpipe. Exhaust gas flowing from the combustion engine to the tailpipe is guided via the exhaust gas inlet and exhaust gas outlet of the casing of the sound generator of the active noise control system before reaching the tailpipe. Naturally, the vehicle comprises further components such as a car body and wheels, but these components are not relevant for the claimed invention. Therefore, description thereof is omitted.

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

Further features of the invention will emerge from the following description of exemplary embodiments in connection with the claims as well as the figures. It is pointed out that the invention is not limited to the embodiments of the described sample embodiments, but rather is determined by the scope of the enclosed patent claims. In particular, individual features in the embodiments of the invention can be realized in different number and combination than in the examples given below. In the following explanation of exemplary embodiments of the invention, reference is made to the enclosed figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1A:
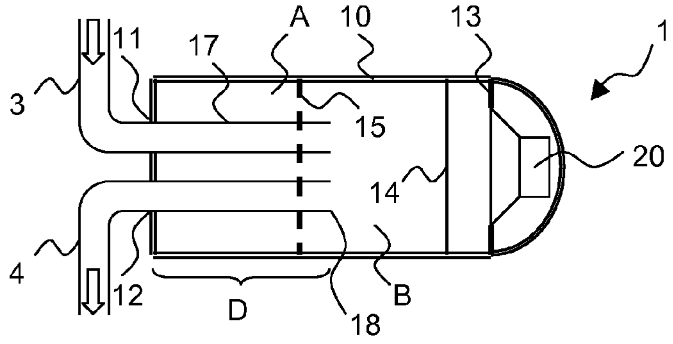
FIG. 1A is a schematic cross-sectional view of a sound generator for an active noise control system according to a first embodiment.

Referring to the drawings, in the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

For the sake of clarity, the figures show only those elements, components and functions that are necessary for an understanding of the present invention. However, embodiments of the invention are not limited to the elements, components or functions explained, but can also contain other elements, components and functions that are deemed necessary for their particular use or functional scope.

A schematic cross-sectional view of a sound generator for an active noise control system according to a first embodiment is shown in FIG. 1A.

The sound generator marked overall with reference number 1 comprises a generally cylinder-shaped casing 10 made of stainless steel. An exhaust gas inlet 11 connected to a supply duct 3 and an exhaust gas outlet 12 connected to an exhaust duct 4 are provided at a basal plane of the casing 10. The supply duct 3 may become fluidly connected to a combustion engine of a vehicle and the exhaust duct 4 may become fluidly connected to a tailpipe. A perforated bridge wall 15 made of stainless steel is coupled to the casing 10 so as to define two chambers A, B within the casing 10. The chambers A, B are separated from one another by the bridge wall 15. The supply duct 3 connected to the exhaust gas inlet 11 continues within the casing 10 as an unperforated supply conduit 17, and the exhaust duct 4 connected to the exhaust gas outlet 12 continues within the casing 10 as an unperforated exhaust conduit 18. Within the casing 10, the supply conduit 17 and the exhaust conduit 18 are arranged in parallel. Exhaust gas flowing in the supply conduit 17 is directed to the opposite direction as exhaust gas flowing in the exhaust conduit 18. Both the supply conduit 17 and the exhaust conduit 18 extend through the chamber A neighboring the exhaust gas inlet 11 and the exhaust gas outlet 12 and communicate with the other chamber B separated from the exhaust gas inlet 11 and the exhaust gas outlet 12 by the bridge wall 15. Sound supplied to chamber B of the casing 10 together with exhaust gas via the supply conduit 17 enters chamber A via holes in the bridge wall 15. The holes in the bridge wall 15 and the dimensions of chamber A are selected such that destructive interference of sound is caused in chamber A. A moving coil loudspeaker 20 used as electro-acoustical transducer is mounted via a mount 13 within the casing 10 at a basal plane of the casing 10 opposite to the exhaust gas inlet 11 and the exhaust gas outlet 12. An acoustic diaphragm made of Poly(p-phenylenterephthalamide) is oriented towards open ends of the supply conduit 17 and the exhaust conduit 18. Thus, the main direction of sound emission of the loudspeaker 20, is oriented towards open ends of the supply conduit 17 and the exhaust conduit 18. The loudspeaker 20 produces sound in dependence on an electrical control signal. A flexible membrane 14 made of heat-resistant silicone is coupled to the casing 10 in between the loudspeaker 20 and the open ends of the supply conduit 17 and the exhaust conduit 18 to separate the loudspeaker 20 from the supply conduit 17 and the exhaust conduit 18 and the exhaust gas inlet 11 and the exhaust gas outlet 12. In the first embodiment, the electro-acoustical transducer is completely contained in the casing 10 of the sound generator and does not have a separate casing.

Figure 1B:
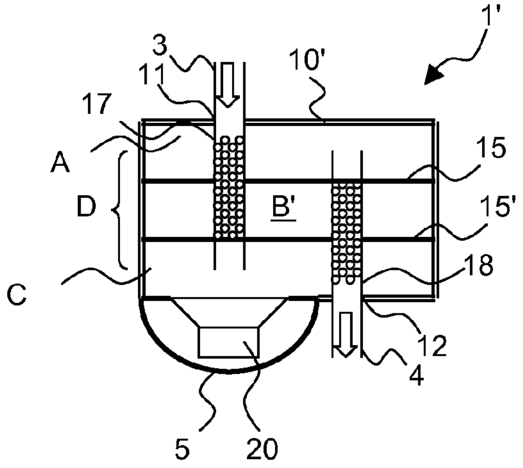
FIG. 1B is a schematic cross-sectional view of a sound generator for an active noise control system according to a second embodiment.

In the following, a second embodiment of a sound generator 1' is explained by reference to FIG. 1B. FIG. 1B shows a schematic cross-sectional view of the sound generator 1'.

The sound generator marked overall with reference number 1' comprises a (first) generally cube-shaped casing 10' made of zinc coated tinplate. An exhaust gas inlet 11 connected to a supply duct 3 and an exhaust gas outlet 12 connected to an exhaust duct 4 are provided at opposing sides of the casing 10'. Two parallel unperforated bridge walls 15, 15' made of zinc coated tinplate are coupled spaced-apart from one another to the casing 10' so as to define three chambers A, B', C within the casing 10'. The supply duct 3 connected to the exhaust gas inlet 11 continues within the casing 10' as a supply conduit 17, and the exhaust duct 4 connected to the exhaust gas outlet 12 continues within the casing 10' as a exhaust conduit 18. Within the casing 10', the supply conduit 17 and the exhaust conduit 18 are arranged in parallel in section D. Exhaust gas flowing in the supply conduit 17 is directed to the same direction as exhaust gas flowing in the exhaust conduit 18; however, there is an offset between the supply conduit 17 and the exhaust conduit 18. Supply conduit 17 extends through the chamber A neighboring the exhaust gas inlet 11 and the central chamber B' and communicates with chamber C neighboring the exhaust gas outlet 12. The supply conduit 17 is perforated in the region crossing chambers A and B'. Exhaust conduit 18 extends through the chamber C neighboring the exhaust gas outlet 12 and the central chamber B' and communicates with chamber A neighboring the exhaust gas inlet 11. The exhaust conduit 18 is perforated in the region crossing chambers C and B'. The holes in the supply conduit 17 and exhaust conduit 18 and the dimensions of chambers A, B' and C are selected such that a Helmholtz resonance is achieved. A moving coil loudspeaker 20 used as electro-acoustical transducer is mounted to a wall of the casing 10 opposite to the exhaust gas inlet 11 and an open end of the supply conduit 17. At the position of the moving coil loudspeaker 20, the wall of the casing 10 comprises a hole. A diameter of the hole in the casing is the same as a diameter of a diaphragm of the moving coil loudspeaker 20. The diaphragm of the moving coil loudspeaker 20 is made of titanium and thus of a material different from the wall of the casing 10. The diaphragm is covering the hole in the wall of the casing 10. A (second) loudspeaker casing 5 made of zinc coated tinplate and housing the loudspeaker 20 is welded to the casing 10' in air-tight manner, thus additionally sealing a hole in the casing 10'. The diaphragm of the moving coil loudspeaker 20 is sealed against the loudspeaker casing 5. Thus, the loudspeaker casing 5 and the diaphragm define a closed internal volume of the moving coil loudspeaker 20.

Figure 1C:
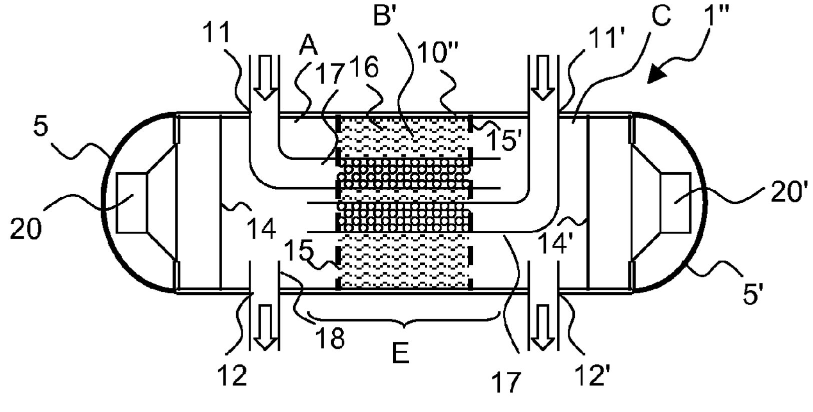
FIG. 1C is a schematic cross-sectional view of a sound generator for an active noise control system according to a third embodiment.

In the following, a third embodiment of a sound generator 1" is explained by reference to FIG. 1C. FIG. 1C shows a schematic cross-sectional view of the sound generator 1".

The sound generator marked overall with reference number 1" comprises a generally cylinder-shaped casing 10" made of stainless steel. Two exhaust gas inlets 11, 11' each connected to an supply duct and two exhaust gas outlets 12, 12' each connected to an exhaust duct are provided at opposing sides of the casing 10". Two parallel perforated bridge walls 15, 15' made of stainless steel are coupled spaced-apart from one another to the casing 10" so as to define three chambers A, B', C within the casing 10". The supply ducts connected to the exhaust gas inlets 11, 11' each continue within the casing 10" as a supply conduits 17, 17' and the exhaust ducts connected to the exhaust gas outlets 12, 12' each continue within the casing 10" as a exhaust conduits 18, 18'. The supply conduits 17, 17' are bent such that within the casing 10" they are arranged in parallel in section E. Exhaust gas flowing in the supply conduits 17, 17' is directed to opposite directions in section E. Supply conduit 17 extends through the chamber A neighboring the exhaust gas inlet 11 and the central chamber B' and communicates with chamber C neighboring the other exhaust gas inlet 11'. Supply conduit 17' extends through the chamber C neighboring the exhaust gas inlet 11' and the central chamber B' and communicates with chamber A neighboring the other exhaust gas inlet 11. The supply conduits 17, 17' are perforated in the region crossing the central chamber B'. The unperforated exhaust conduits 18, 18' simply leave chambers A and C, respectively, without crossing chamber B'. Roving fiberglass is contained in the central chamber B' as sound absorbing material. Two moving coil loudspeakers 20, 20' used as electro-acoustical transducers are mounted to opposing walls of the casing 10. At the position of the moving coil loudspeakers 20, 20' the wall of the casing 10 comprises holes. A diameter of the holes in the casing is 10% larger than a diameter of each diaphragm of the moving coil loudspeakers 20, 20'. The diaphragm of each moving coil loudspeaker 20 is made of aluminum and thus of a material different from the wall of the casing 10. The diaphragm of each loudspeaker is covering a major part of one of the holes in the wall of the casing 10. The acoustic diaphragm of one loudspeaker 20 is oriented towards an open end of supply conduit 17' and the acoustic diaphragm of the other loudspeaker 20' is oriented towards an open end of supply conduit 17. Flexible membranes 14, 14' made of Polytetrafluoroethylene are coupled to the casing 10" in between the loudspeakers 20, 20' and the open ends of the supply conduits 17, 17' and the exhaust conduits 18, 18' to separate the loudspeakers 20, 20' from corrosive exhaust gas. The acoustic diaphragms of the loudspeakers 20, 20' seal the holes in the casing 10" in an air-tight manner. Two loudspeaker casings 5, 5' made of stainless steel are attached to the casing 10" in a removable manner. Each loudspeaker casing 5, 5' houses one of the loudspeakers 20, 20'. Together with the diaphragm of the respective loudspeaker, each loudspeaker casing 5, 5' defines an internal volume of each moving coil loudspeaker 20, 20'.

Figure 2:
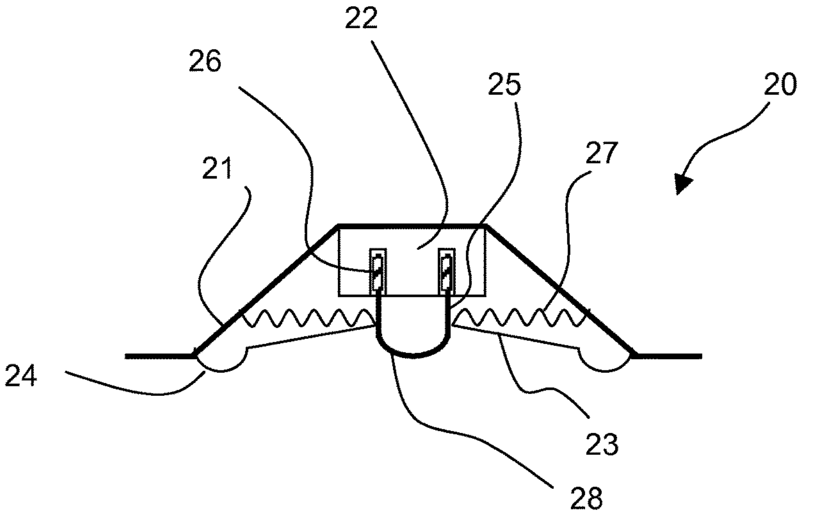
FIG. 2 is a schematic cross-sectional view of an electro-acoustic transducer that may be used in the sound generator of FIG. 1A, 1B or 1C.

A schematic cross-sectional view of a moving coil loudspeaker that is used as electro-acoustic transducer in the sound generators of FIG. 1A, 1B or 1C above is shown in FIG. 2.

The loudspeaker marked overall with reference number 20 comprises a sheet metal basket 21, which carries a permanent magnet 22. The basket 21 has the overall shape of a truncated cone. The basket 21 carries an acoustic diaphragm 23 via a surround 24 made from flexible plastic. Titanium is used for the diaphragm 23 and heat-resistant silicone is used for the surround 24 to ensure sufficient resistance against heat and corrosion. The diaphragm 23 has the overall shape of a truncated cone. A dust cap 28 and bobbin 25 are secured to the top surface of the truncated cone formed by the diaphragm 23. The end of the bobbin 25 averted from the diaphragm 23 is arranged in an annular gap provided in the permanent magnet 22, and carries a voice coil 26. As a result, this coil 26 is located in a constant magnetic field generated by the permanent magnet 22. It should be noted that the width of the annular gap on the figure is greatly exaggerated. The bobbin 25 is centered relative to the annular gap by means of a centering spider 27. The centering spider 27 consists of springs radially stretched between the bobbin 25 and basket 21. In the embodiment shown, the basket 21, surround 24, diaphragm 23, dust cap 28, bobbin 25 and permanent magnet 22 are rotationally symmetrical bodies with the same axis of symmetry. Application of an electrical control signal to the voice coil 26 causes movement of the bobbin 25 together with the diaphragm 23 and thus the generation of sound due to the Lorentz force.

Figure 3:
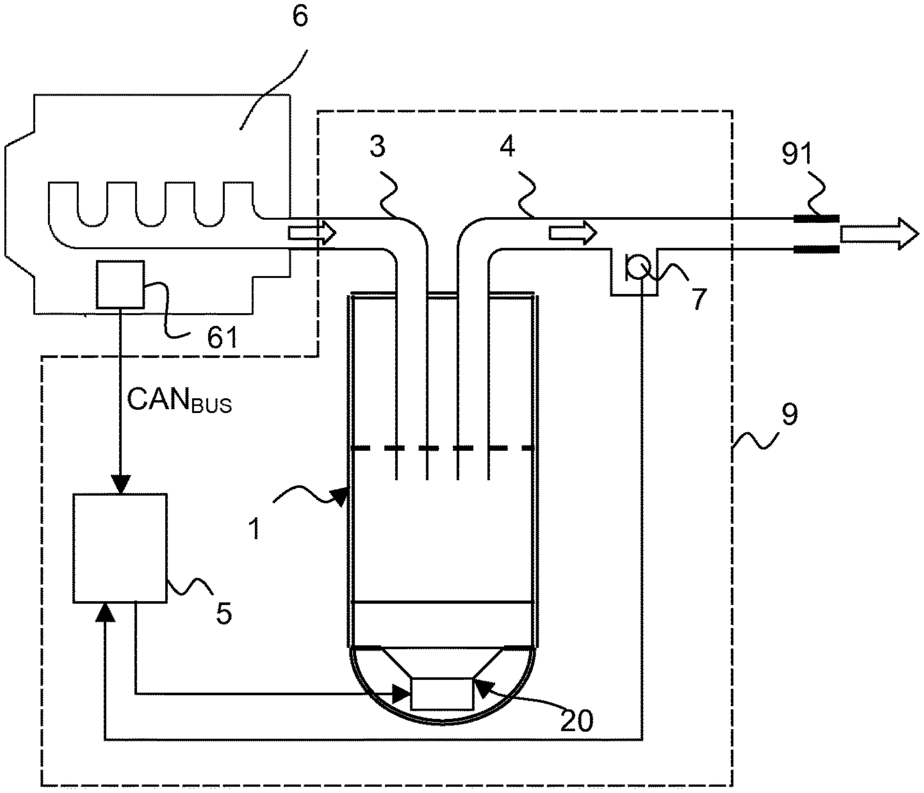
FIG. 3 is a block diagram of an active noise control system using in the sound generator of FIG. 1A, 1B or 1C.

FIG. 3 shows a block diagram of an active noise control system using in the sound generator of FIG. 1A, 1B or 1C and the moving coil loudspeaker of FIG. 2. The following will focus only on the special features of the active noise control system. The active noise control system marked overall with reference number 9 is used to actively extinguish or influence sound waves in exhaust systems of a vehicle powered by an internal combustion engine. The exhaust gas inlet 11 of the casing of the sound generator 1 is connected to an exhaust gas outlet of an internal combustion engine 6 via a supply duct 3. The exhaust gas outlet 12 of the casing of the sound generator 1 is connected to a tailpipe 91 via an exhaust duct 4. The active noise control system 9 comprises a controller 90, which in order to exchange control or measuring signals is electrically connected with an engine controller 61 of an internal combustion engine 6 via a CAN-bus. The controller 61 is further electrically connected with an error microphone 7 situated in a duct 4 of an exhaust system, as well as with the loudspeaker 20 of the sound generator 1.

As a function of an operating state of the internal combustion engine 6 acquired by the engine controller 61 of the internal combustion engine 6, the controller 90 calculates electrical control signals, which are fed to the loudspeaker 20 so as to generate sound, which extinguishes airborne noise guided in the supply duct 3 and the exhaust duct 4 at least partially. The electrical control signals can be regulated by using signals output by the error microphone 7, so that airborne noise is emitted at a reduced sound pressure at a tailpipe 91 of the exhaust system.

Figure 4:
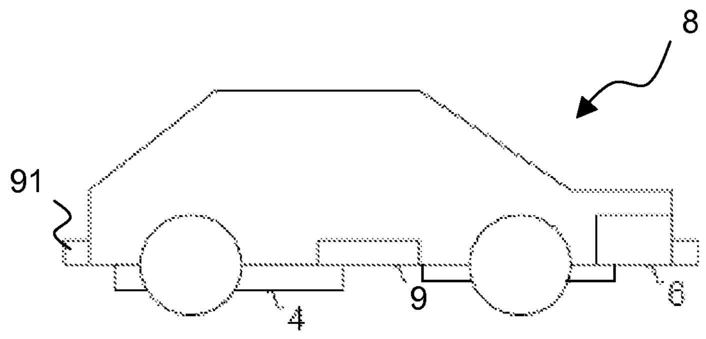
FIG. 4 is a schematic view showing a vehicle using the active noise control system of FIG. 3.

FIG. 4 schematically shows a vehicle 8 using the above described active noise control system 9 of FIG. 3. The active noise control system is mounted to an undercarriage of the vehicle 6. Besides other features, the vehicle 8 comprises a combustion engine 6 and an exhaust duct 4 terminating in a tailpipe 91.

It is obvious that the above described sound generator may work as sound absorber, in dependency on a control signal used for the at least one electro-acoustical transducer.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

While specific embodiments of the invention have been shown and described in detail to illustrate the application of the principles of the invention, it will be understood that the invention may be embodied otherwise without departing from such principles.

What is claimed is:

1. A sound generator for an active noise control system for a vehicle with an internal combustion engine, the sound generator comprising:

a casing with at least one exhaust gas inlet and at least one exhaust gas outlet different from the at least one exhaust gas inlet;

an electro-acoustical transducer configured to produce sound in dependence on an electrical control signal, the electro-acoustical transducer being located directly attached to the casing and the electro-acoustical transducer comprising a moving coil loudspeaker directly attached to the casing, wherein the casing comprises a hole or plural holes at a direct attachment position of the electro-acoustical transducer, the electro-acoustical transducer covering the hole or holes in the casing, wherein sound generated by the electro-acoustical transducer is superimposing sound supplied to the casing together with exhaust gas via the at least one exhaust gas inlet within the casing; and at least one flexible membrane coupled to the casing in an air-tight manner so as to separate the electro-acoustical transducer from the at least one exhaust gas inlet and the at least one exhaust gas outlet, wherein the at least one flexible membrane is provided in addition to the electro-acoustical transducer and the at least one flexible membrane is suitable to prevent corrosive exhaust gas from reaching the electro-acoustical transducer while sound waves generated by the electro-acoustical transducer enter the casing via the flexible membrane.

2. A sound generator according to claim 1, wherein the casing comprises at least one of:

a chamber in fluid communication with both the at least one exhaust gas inlet and the at least one gas outlet wherein the chamber is at least one of lined with sound absorbing material and provided with roving fiberglass; and a resonating chamber, harmonically tuned to cause destructive interference comprising a cavity resonator using Helmholtz resonance.

3. A sound generator according to claim 1, wherein the electro-acoustical transducer comprises an acoustic diaphragm, the acoustic diaphragm being located at a spaced location from the at least one flexible membrane.

4. A sound generator according to claim 3, wherein the acoustic diaphragm forms part of a walling of the casing and is comprised of a material different from a material of a remainder of the walling of the casing.

5. A sound generator according to claim 1, further comprising:

a bridge wall within the casing and coupled to the casing so as to define at least two chambers separated from one another by the bridge wall;

a supply conduit connected to one of the at least one exhaust gas inlet, extending through one of the chambers and communicating with another of the chambers; and an exhaust conduit within the casing and connected to the at least one exhaust gas outlet, extending through one of the chambers and communicating with another of the chambers.

6. A sound generator according to claim 5, wherein the supply conduit comprises a supply conduit section and the exhaust conduit comprises an exhaust conduit section wherein the supply conduit section is supported extending in parallel to the exhaust conduit section.

7. A sound generator according to claim 5, wherein at least one of:

the bridge wall is perforated; and one or more of the supply conduit and the exhaust conduit is perforated.

8. A sound generator according to claim 1, further comprising:

a bridge wall within the casing and coupled to the casing so as to define first and second chambers separated from one another by the bridge wall;

a supply conduit connected to one of the at least one exhaust gas inlet and extending through the first chamber and communicating with the second chamber; and an exhaust conduit connected to the at least one exhaust gas outlet and extending through the first chamber and communicating with the second chamber, wherein the electro-acoustical transducer is arranged opposing an open end of at least one of the supply and exhaust conduits.

9. A sound generator according to claim 8, wherein the supply conduit comprises a supply conduit section and the exhaust conduit comprises an exhaust conduit section wherein the supply conduit section is supported extending in parallel to the exhaust conduit section.

10. A sound generator according to claim 8, wherein at least one of:

the bridge wall is perforated; and one or more of the supply conduit and the exhaust conduit is perforated.

11. A sound generator according to claim 1, further comprising:

a first bridge wall within the casing and coupled to the casing;

a second bridge wall within the casing and coupled to the casing, the first bridge wall, the second bridge wall and the casing cooperating to define first, second and third chambers separated from one another by the bridge walls;

a supply conduit connected to the at least one exhaust gas inlet and extending through the first and second chambers and communicating with the third chamber; and an exhaust conduit connected to the at least one exhaust gas outlet and extending through the third and second chamber and communicating with the first chamber, wherein the electro-acoustical transducer is arranged opposing an open end of the supply and exhaust conduits.

12. A sound generator according to claim 11, wherein the supply conduit comprises a supply conduit section and the exhaust conduit comprises an exhaust conduit section wherein the supply conduit section is supported extending in parallel to the exhaust conduit section.

13. The sound generator according to claim 1, further comprising:

an additional exhaust gas inlet;

an additional exhaust gas outlet;

a bridge wall within the casing and coupled to the casing so as to define at least two chambers separated from one another by the bridge wall;

a supply conduit connected to the at least one exhaust gas inlet, extending through one of the chambers and communicating with another of the chambers;

an additional supply conduit connected to the additional exhaust gas inlet, extending through one of the chambers and communicating with another of the chambers;

an exhaust conduit connected to the at least one exhaust gas outlet;

an additional exhaust conduit connected to the additional exhaust gas outlet;

an additional electro-acoustical transducers, wherein:

the electro-acoustical transducer is arranged opposing an open end of the supply conduit connected to the at least one exhaust gas inlet and the additional electro-acoustical transducer is arranged opposing an open end of the additional supply conduit; or the electro-acoustical transducer is arranged opposing an open end of the exhaust conduit connected to the at least one exhaust gas outlet and the additional electro-acoustical transducer is arranged opposing an open end of an exhaust conduit connected to the additional exhaust gas outlet.

14. A sound generator according to claim 1, further comprising a second casing different from the casing, the second casing being attached to the casing, wherein the second casing houses the electro-acoustical transducer.

15. A sound generator according to claim 1, wherein the one or more holes has a hole diameter, the moving coil comprising a diaphragm, the diaphragm having a diaphragm diameter, the diaphragm diameter being greater than the hole diameter, the casing comprising a wall having a first portion and a second portion, the first portion being located opposite the second portion, the wall defining at least one of the one or more holes, wherein the at least one of the one or more holes is located between the first portion of the wall and the second portion of the wall, the moving coil loudspeaker bridging the at least one of the one or more holes, wherein the moving coil loudspeaker engages the first portion of the wall and the second portion of the wall.

16. A sound generator according to claim 1, further comprising:

a supply conduit connected to the at least one exhaust gas inlet, wherein a chamber is defined at least by at least a portion of the casing and at least a portion of the at least one flexible membrane, the supply conduit being in fluid communication with the chamber; and an exhaust conduit connected to the at least one exhaust gas outlet, the exhaust conduit being in fluid communication with the chamber.

17. A sound generator according to claim 16, wherein the supply conduit comprises a supply conduit end portion having a supply conduit outlet, the exhaust conduit comprising an exhaust gas end portion having an exhaust conduit gas inlet, the supply conduit outlet and the exhaust conduit gas inlet being arranged in the chamber.

18. An active noise control system comprising:

a sound generator comprising a flexible membrane and a casing with at least one exhaust gas inlet and at least one exhaust gas outlet different from the at least one exhaust gas inlet and an electro-acoustical transducer configured to produce transducer sound in dependence on an electrical control signal, the electro-acoustical transducer being directly attached to the casing, the electro-acoustical transducer comprising a moving coil loudspeaker directly connected to the casing, the casing comprising a hole or a plurality of holes, the electro-acoustical transducer covering the hole or the plurality of holes in the casing, the hole or the plurality of holes defining a direct attachment position of the electro-acoustical transducer, the flexible membrane being connected to the casing, the electro-acoustical transducer being sealed from the at least one exhaust gas outlet and the at least one exhaust gas inlet via the flexible membrane, the flexible membrane being impermeable to gas and permeable to at least electro-acoustical transducer sound waves, wherein the electro-acoustical transducer sound waves generated by the electro-acoustical transducer pass through the flexible membrane into an interior of the casing, the sound waves being superimposed on transmitted sound transmitted to the interior of the casing, wherein the interior of the casing receives exhaust fluid;

a control unit configured to create an electrical control signal and to supply the electrical control signal to the electro-acoustical transducer of the sound generator, wherein the electrical control signal drives the electro-acoustical transducer to partially or completely cancel exhaust sound waves guided in an exhaust gas system of the vehicle.

19. A vehicle comprising:

a combustion engine; and an active noise control system comprising:

a sound generator comprising a sound vibration permeable and fluid impermeable flexible membrane and a casing with at least one exhaust gas inlet and at least one exhaust gas outlet different from the at least one exhaust gas inlet and an electro-acoustical transducer configured to produce transducer sound in dependence on an electrical control signal, the electro-acoustical transducer being directly attached to the casing, the casing comprising one or more holes, the electro-acoustical transducer comprising a moving coil loudspeaker, the moving coil loudspeaker being directly attached to the casing, wherein the coil loudspeaker covers each of the one or more holes, the one or more holes defining at least one direct attachment position of the electro-acoustical transducer, the sound vibration permeable and airtight flexible membrane being connected to the casing, wherein a chamber is defined at least by at least a portion of the casing and at least a portion of the sound vibration permeable and fluid impermeable flexible membrane, wherein transmitted sound is transmitted to the chamber, wherein the transducer sound passes through the sound vibration permeable and fluid impermeable flexible membrane into the chamber, the electro-acoustical transducer being sealed from the exhaust gas via the sound vibration permeable and fluid impermeable flexible membrane, wherein the chamber receives the exhaust gas; and a control unit configured to create an electrical control signal and to supply the electrical control signal to the electro-acoustical transducer of the sound generator, wherein the electrical control signal drives the electro-acoustical transducer to partially or completely cancel exhaust sound waves guided in an exhaust gas system of the vehicle, wherein:

the exhaust gas inlet of the active noise control system is connected to the combustion engine and the exhaust gas outlet of the active noise control system is connected to an exhaust-pipe end; and the exhaust gas flowing from the combustion engine to a tailpipe is guided via the exhaust gas inlet and exhaust gas outlet of the casing of the sound generator of the active noise control system before reaching the tailpipe.

20. A vehicle according to claim 19, further comprising:

a supply conduit connected to the at least one exhaust gas inlet, the supply conduit being in fluid communication with the chamber, the exhaust gas being delivered to the chamber via the supply conduit; and an exhaust conduit connected to the at least one exhaust gas outlet, the exhaust conduit being in fluid communication with the chamber.

* * * * *